(12) United States Patent
Cramer et al.

(10) Patent No.: US 6,236,146 B1
(45) Date of Patent: May 22, 2001

(54) PIEZOELECTRIC ACTUATOR WITH A NEW TYPE OF CONTACTING AND A METHOD FOR THE PRODUCTION THEREOF

(75) Inventors: Dieter Cramer, Holzkirchen; Hans Hellebrand, München; Karl Lubitz, Ottobrunn; Andreas Wolff, München; Christoph Hamann, Kirchheim; Clemens Scherer, Gilching, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/254,764
(22) PCT Filed: Nov. 6, 1997
(86) PCT No.: PCT/DE97/02587
§ 371 Date: Mar. 11, 1999
§ 102(e) Date: Mar. 11, 1999
(87) PCT Pub. No.: WO98/20721
PCT Pub. Date: May 22, 1998

(30) Foreign Application Priority Data

Nov. 12, 1996 (DE) ................................................ 196 46 676

(51) Int. Cl.$^7$ ....................................................... H01L 41/08
(52) U.S. Cl. ............................................................. 310/366
(58) Field of Search ................................................ 310/366

(56) References Cited

U.S. PATENT DOCUMENTS 5,438,232 * 8/1995 Inoue et al. ........................... 310/366

FOREIGN PATENT DOCUMENTS

| 0 584 842 A2 | 3/1994 | (EP) | ............... | H01L/41/08 |
| 3-4576 | * 1/1991 | (JP) | ..................... | 310/366 |
| 3-154387 | * 7/1991 | (JP) | ..................... | 310/366 |

* cited by examiner

Primary Examiner—Thomas M. Dougherty
(74) Attorney, Agent, or Firm—Schiff Hardin & Waite

(57) ABSTRACT

A piezoelectric actuator, and method of producing same, wherein electrically conductive contact tabs are applied onto metallization strips in such a way that a projecting region remains, so that in the event of cracks nevertheless occurring, such cracks run in the projecting region of the contact tab and are bridged electrically.

11 Claims, 2 Drawing Sheets

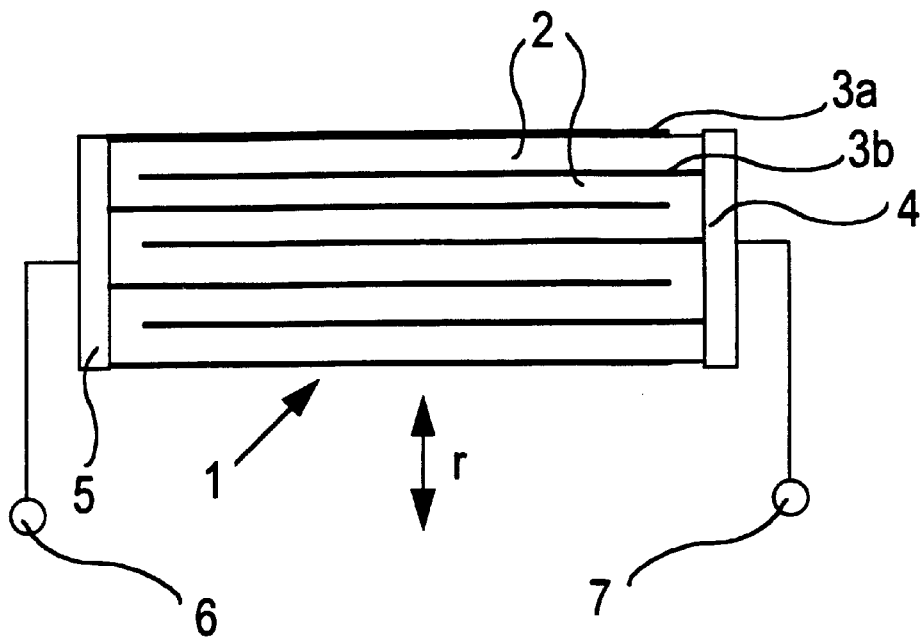
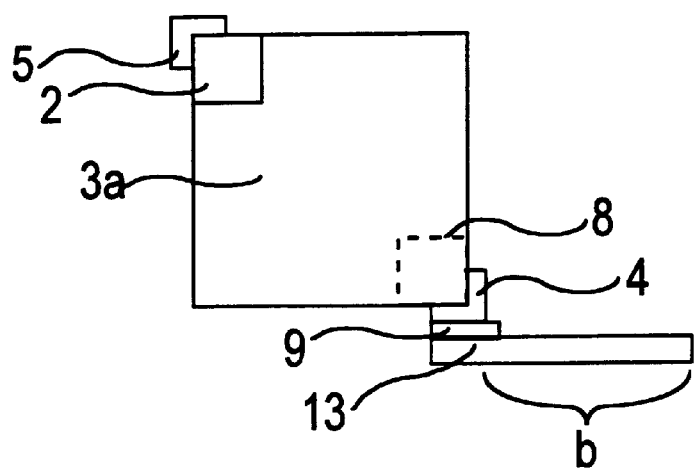
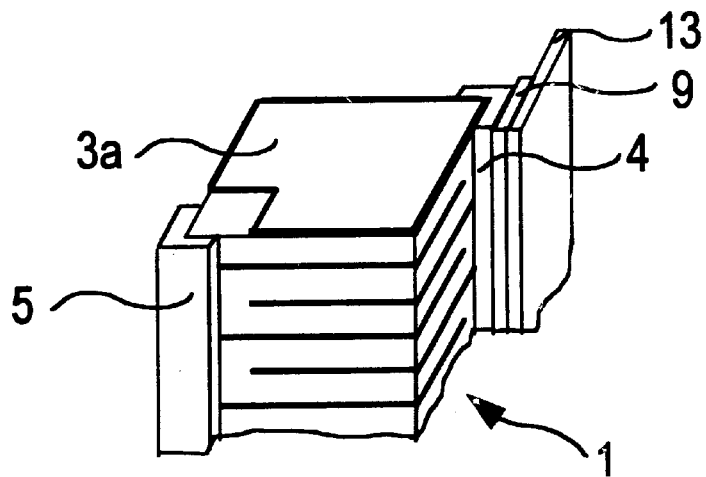

PIEZOELECTRIC ACTUATOR WITH A NEW TYPE OF CONTACTING AND A METHOD FOR THE PRODUCTION THEREOF

BACKGROUND OF THE INVENTION

1. Field of the Invention

The present invention relates to a piezoelectric actuator, and method of producing the same, wherein a reliable electrical contacting design is employed which avoids the negative consequences of potentially-arising voltage cracks.

2. Description of the Prior Art

Piezoelectric actuators normally include a plurality of piezoelectric elements arranged in a stack. Each of these elements, in turn, includes a piezoceramic layer which is provided on both sides with metallic electrodes. If a voltage is applied to these electrodes, the piezoceramic layer reacts with a lattice distortion which leads to a usable lengthwise expansion along a major axis. Since this amounts to less than two parts per thousand of the layer thickness along the major axis, a correspondingly higher layer thickness of active piezoceramic must be provided in order to achieve a desired absolute lengthwise expansion. With increasing layer thickness of the piezoceramic layer within one piezoelectric element, however, the voltage necessary for the response of the piezoelectric element also rises. In order to keep this within manageable limits, multilayer actuators are produced in which the thicknesses of individual piezoelectric elements normally lie between 20 and 200 µm. A piezoelectric actuator must therefore have an appropriate number of individual elements or layers for a desired lengthwise expansion.

Known piezoelectric actuators of multilayer design, therefore, include a total of up to several hundred individual layers. In order to produce them, piezoceramic green films are arranged alternately with electrode material to form a stack. Thereafter, they are laminated and sintered together to form a monolithic composite of up to about 5 mm in height. Larger actuators having a larger absolute deflection can be obtained, for example, by bonding a plurality of such stacks. Adequately high stiffnesses, in particular when high forces have to be transmitted with the piezoelectric actuator, are possessed by piezoelectric actuators of completely monolithic multilayer design, which exhibit an adequately solid composite of the individual layers in the stack.

In order to make electrical contact with such piezoelectric actuators of multilayer design, for example, metallization strips are applied to the outside of the piezoelectric actuator or else in a hole in the center of the surface of the individual actuators. In order for one electrode layer to be used as the electrode for the two adjacent piezoceramic layers, the electrical contacting of the electrode layers within the stack is carried out with alternating polarity. For example, in order to connect each second electrode layer to one of the metallization strips, the latter must be insulated from the electrode layers lying in between. This is brought about in a simple way wherein each second electrode layer has, in the region of the one metallization strip, a cut-out in which it is not led up to the metallization strip. The remaining electrode layers then have the cut-outs in the region of the second metallization strip in order to make contacting possible with alternating polarity.

A further possibility for such alternating contacting consists in insulating each second electrode layer in the region of the metallization strips. This is brought about, for example, by means of glass insulations which, following the production of the stacked monolithic piezoelectric actuator, are applied at the edge of the electrode layers; for example, electrophoretically. However, this process is expensive and is restricted to piezoelectric actuators whose individual ceramic layers have a thickness of at least 100 µm. Because of the low glass insulation path, piezoelectric actuators that are contacted in this way are typically not suitable for either high reliability or unprotected ambient conditions.

Piezoelectric actuators whose alternating contacting is carried out via cut-outs in the electrode layers are piezoelectrically inactive in the contacting region, since it is not possible for any electric field to build up there, as a result of one electrode being missing in each case. This has the result, both in the polarization and during the operation of the piezoelectric actuator, that mechanical stresses build up in this piezoelectrically inactive contacting region. This result which can lead to cracks on the metallization strips parallel to the electrode layers. This can further lead to the complete severing of the metallization strips and has the consequence that, in the case of a point-like voltage supply from the outside to the metallization strips, a part of the piezoelectric actuator becomes uncoupled from the voltage supply. Hence, it becomes inactive. The number of cracks depends on the overall height of the actuator and on the strength of the boundary surface between inner electrode and piezoceramic. The number of cracks may rise further in continuous operation, given alternating load conditions. A crack opening that already exists at the time of polarization is further enlarged parallel to the driving of the actuator. When the voltage is switched off, however, it returns once more to the initial value. Therefore, during dynamic operation, a dynamic change to the cracks or a dynamic change to the crack openings is observed which can further damage the metallization strips.

It is therefore an object of the present invention to produce a piezoelectric actuator which has a reliable electrical contacting design which avoids the negative consequences of potentially arising voltage cracks.

SUMMARY OF THE INVENTION

Accordingly, piezoelectric actuator of the invention may have a conventional and preferably monolithic structure. In the manner of a stack, piezoelectric ceramic layers and electrode layers are alternately arranged one above another and are preferably sintered together. At least two metallization strips for making alternating contact with the electrode layers are applied to the stack on the outside. According to the present invention, the metallization strips are connected to contact tabs which have an electrically conductive layer. The connection is electrically conductive and is carried out at least over the entire height of the electrode layers to be contacted. As such, a projecting region of the contact tabs remains at the side of the metallization strips. The contact tab is preferably designed to be thin, but tear-resistant, and preferably flexible.

The projecting contact tab provides an electrically conductive area that is enlarged and connected to the metallization strips without the inactive region of the piezoelectric actuator having to be enlarged at the same time. If voltage cracks occur in the metallization strip during the polarization or the operation of the piezoelectric actuator, they are bridged by the electrically conductive layer in the projecting region of the contact tab. The width of the contact tabs and, hence, the width of the projecting region is dimensioned such that cracks in the metallization strips having large crack openings which admittedly lead to a local crack in the contact tab as well. However, this crack reliably stops still within the contact tab. In this way, all the cracks occurring within the metallization strips can be bridged in an electrically conductive manner, with the result that all the originally contacted electrode layers remain electrically connected, and the entire actuator exhibits no reduction in capacity.

With the present invention it is also possible to increase the number of layers and, accordingly, the stack height of the piezoelectric actuator, without the risk of crack formation which rises therewith at the same time. This may lead to interruption of the electrical contacting and to impairment of the serviceability of the piezoelectric actuator. It is thus possible to produce monolithic piezoelectric actuators of multilayer design having a greater stack height and thus a greater usable deflection. Whereas large deflections could hitherto be obtained only by bonding together a plurality of smaller monolithic actuators, it is now possible for the expansion of individual monolithic piezoelectric actuators to be increased without having to tolerate damage to the actuators. Only monolithic piezoelectric actuators possess the high stiffnesses with which high forces can be transmitted reliably in dynamic operation.

In an embodiment of the present invention, the contact tab is composed of a composite material which, in addition to the electrically conductive layer, further includes at least one plastic layer. This plastic layer increases the tear resistance of the contact tab and is used for improved protection of the contact tab against further tearing during the operation of the piezoelectric actuator. A contact tab made of composite material also has the advantage that it can be lighter than, for example, a contact tab designed purely of metal; for example, a metal foil. During the dynamic operation of the piezoelectric actuator, therefore, there is no noticeable additional mechanical ballast. The contact tab is mechanically flexible and can be adapted easily to various types of piezoelectric actuator installations and, for example, to various installation housings. By contrast with conventional contacting designs, only slight additional material costs occur.

In a further embodiment of the present invention, the contact tab includes a metal-coated plastic film. The metallic, electrically conductive layer is additionally laminated with this further plastic layer in the projecting region of the contact tab. This has the advantage that the contact tab is electrically insulated on all sides in the projecting region, with the result that, even given severe bonding over in the projecting region, no short circuit with the electrode layers that are freely accessible at the edge of the piezoelectric actuator can occur. With the plastic layers applied to both sides of the electrically conductive layer the tear resistance of the contact tab is additionally increased.

In the process for producing a piezoelectric actuator according to the present invention, a monolithic multilayer composite is produced in a manner that is substantially conventional. To this end, green films printed with electrode material can be stacked one above another and sintered together freely or under pressure. The piezoceramic films and, if appropriate, the finished piezoelectric actuators may have a round, rectangular or arbitrarily other shaped cross-section. The electrode material is printed onto the film in such a way that, following the stacking, only each second electrode layer is led, in the contacting region, as far as the outer edge of the piezoceramic film or of the subsequent stack. By applying in each case a metallization strip to the two contacting regions, each second electrode layer is connected to the first metallization strip and the remaining electrode layers to the second metallization strip. The metallization strip includes a metal which is vapor-deposited or sputtered on or is applied with the aid of a metal-containing paste and is subsequently baked.

A contact tab is then applied to the metallization strips in such a way that its electrically conductive layer is electrically and firmly connected over the entire stack height of the contacted electrode layers. The electrically conductive connection can be carried out with the aid of a conductive adhesive, a soldering process or, if appropriate, may be connected at the same time as the baking of the metallization strips. The contact tab is preferably soldered on. A particularly non-damaging soldering method is laser-beam soldering. This enables the selective coupling of the energy required for soldering into the contact tab, wherein the piezoelectric actuator itself is subjected to only minimal thermal loading. It therefore does not have to be preheated, with the result being that no damage to the ceramic can occur as a result of thermal shock or overheating.

The solder required for soldering is preferably already applied to the contact tab. For this purpose, it is coated in the region designated for soldering in a conventional way; for example, by means of vapor deposition, sputtering or electroplating, with a suitable solder of conventional composition.

In order to apply the contact tab through laser-beam soldering, it is advantageous if the contact tab includes a composite material made of a plastic and an electrically conductive layer whose plastic is transparent to the wavelength of the laser used for soldering. In this way, the laser energy can be coupled virtually completely into the electrically conductive layer or the solder applied thereon.

The soldering of the metallization strips to the contact tab is carried out continuously over the entire length of the metallization strip or at least over the entire stack height of the electrode layers to be contacted. For this purpose, a continuous-wave laser or an appropriately screened pulsed laser can be used. The duration of the laser soldering is typically only a few seconds and may be carried out in automation fashion.

Additional features and advantages of the present invention are described in, and will be apparent from, the Detailed Description of the Preferred Embodiments and the Description of the Drawings.

DESCRIPTION OF THE DRAWINGS

FIG. 1 shows the contacting of a piezoelectric actuator in a schematic cross-sectional view.

FIG. 2 shows a piezoelectric actuator of the present invention in a schematic cross-sectional view.

FIG. 3 shows a piezoelectric actuator of the present invention in a perspective schematic view.

DETAILED DESCRIPTION OF THE PREFERRED EMBODIMENTS

Figure 4:
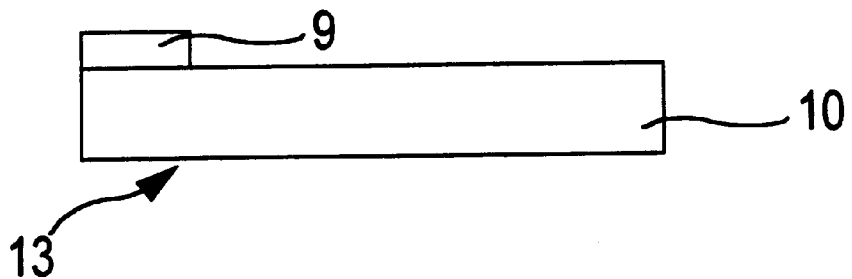
FIGS. 4 to 6 show various embodiments of a contact tab in schematic cross-sectional view.

FIG. 1 shows a piezoelectric actuator, known per se, of multilayer design. The actuator includes a stack of piezoceramic layers 2 with electrode layers 3 arranged between them. An arbitrary PZT ceramic (=lead zirconate titanate) can be used as the piezoceramic. The electrode layers 3 are made of a suitable material, preferably of a silver-containing baking paste. The electrode layers 3 may contain still additional oxidic additives for the purpose of better adhesion to the piezoceramic layers 2, as well as other metals on their own or as further additive; for example, platinum or palladium.

The stack, illustrated here with six piezoceramic layers 2, is combined to form a solid composite by being sintered together, if appropriate under elevated pressure. At the edge of the stack, parallel to the stack direction, metallization strips 4, 5 are applied. These likewise may be composed of a baked silver paste, but then may also be vapor-deposited or sputtered on. However, neither the type of metal nor the type of application of the metallization strips 4 and 5 to the piezoelectric actuator stack is decisive. The electrical connections 6, 7 are now a in turn, fastened to each metallization strip 4, 5; for example, by soldering on an electric conductor. The connection can be produced at one or several points of either a metallization strip or the contact tab. Following polarization parallel to the stack direction, a serviceable piezoelectric actuator is obtained which exhibits a deflection in the direction r when a voltage is applied to the connections 6, 7. Monolithic actuators for the transmission of large forces may reach stack heights of up to 40 mm and, depending on the thickness of the piezoceramic layers, may include up to 1000 ceramic layers 2.

Furthermore, FIG. 1 reveals how the individual electrode layers are connected in parallel such that each second electrode layer is at the same polarity. For this purpose, the electrode layers 3 are applied on the piezoceramic layers 2 such that cut-outs 14 remain in the metallization strips 4, 5 in the contacting region and are not covered by electrode material. These cut-outs 14 are used for the insulation of the electrode layer with respect to the metallization strip to which they are not intended to be connected.

FIG. 2 shows piezoelectric actuator of the present invention in cross-section through the plane of an inner electrode. As shown, the actuator is illustrated with a square outline, but it may also have any other arbitrary shapes. The uppermost electrode layer 3a has a cut-out in the left upper corner at which the piezoceramic layer 2 lying underneath is visible. This cut-out may have not only a square dimension as shown, but also a only at the corner but also in the centre of the actuator side. The electrode layer 3a is electrically conductively connected to the metallization strip 4, which here is applied at the corner. The metallization strip 5 applied at the opposite corner has no contact with the electrode layer 3a because of the cut-out in the latter. On the other hand, it is connected to the electrode layer 3b lying under 20 neath (not visible here), which has at the opposite corner of the actuator the cut-out that is illustrated with dashed lines and designated by 8.

According to the present invention, the metallization strips 4, 5 are now connected to a contact tab 13. The connection is carried out over the entire height of the stack or at least over the entire height of the electrode layers 3 to be contacted. The contact tab 13 is applied with the aid of a connector 9; for example, a conductive adhesive or a solder layer. The contact tab 13 has a projecting region with respect to the stack or the connection to the metallization strip 4, the length b of this region being adequate for cracks in the metallization strip occurring during the operation or the polarization of the piezoelectric actuator 1 to run out within the contact tab 13. For exemplary piezoelectric actuators having a basic area of 7×7 mm and a height of up to 40 mm, it is sufficient if the projecting region has a width b of 5 to 10 mm. At lower stack heights, the width of the projecting region b can also be selected to be smaller.

At the end of the projecting region b, further contacting can be performed in any desired way, for example, by soldering on a wire in order to lead further to the electrical connections 6, 7. In the same way, the second metallization strip 5 is connected to a contact tab 13 of identical type. Laser-beam soldering is used as the preferred application method.

FIG. 3 shows, in the form of a detail and in a perspective schematic illustration, a piezoelectric actuator 1 having a fitted contact tab 13. Although the piezoelectric actuator illustrated has a lengthwise expansion, it is not suitable for the transmission of large forces. For this purpose, piezoelectrically inactive end plates, not illustrated here, are required on the upper and lower sides of the piezoelectric actuator 1, and are likewise monolithically joined to the stack.

FIG. 4 shows the simplest embodiment of a contact tab in a schematic cross-section, in which the contact tab includes only one electrically conductive layer; for example, a metal foil 10. Optionally, the electrically conductive layer (foil) 10 already may be coated along one edge with solder 9 or with another electrically conductive connecting method, which is used for the connection to the metallization strips 4, 5. The length of the contact tab vertically in relation to the illustrated section plane corresponds, for example, to the stack height of the piezoelectric actuator 1, whereas the width of the contact tab 13 or of the film 10 corresponds at least to the width b of the projecting region plus the width of the connection to the metallization strips. For the piezoelectric actuators of 7×7×40 (mm)$^3$, cited by way of example, a projecting region b of 5 to 10 mm is adequate.

Figure 5:
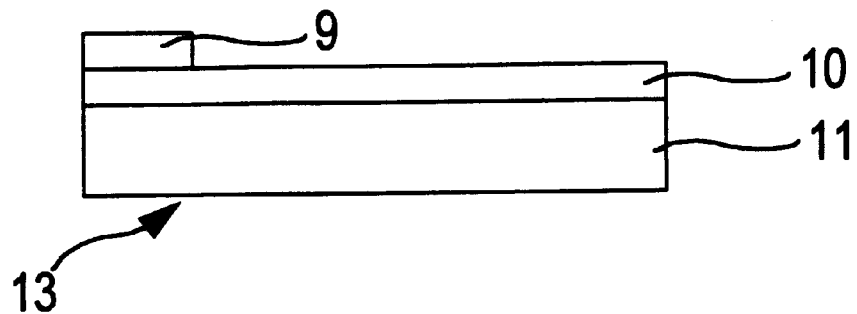

FIG. 5 shows a further design of the contact tab 13, in which the latter includes a composite material made of a carrier 11 and an electrically conductive layer 10. The carrier 11 used is, for example, a plastic film that is coated with an electrically highly conductive metal 10. In one embodiment of the present invention, a Kapton® film of 25 $\mu$m thickness, for example, is used as the carrier 11, which is coated with a suitable metal; for example, with 25 $\mu$m of copper. As the connector 9, a tin layer is applied, for example by means of electroplating. The use of copper for the electrically conductive layer 10 has the advantage of good solderability and of high electrical conductivity.

Figure 6:
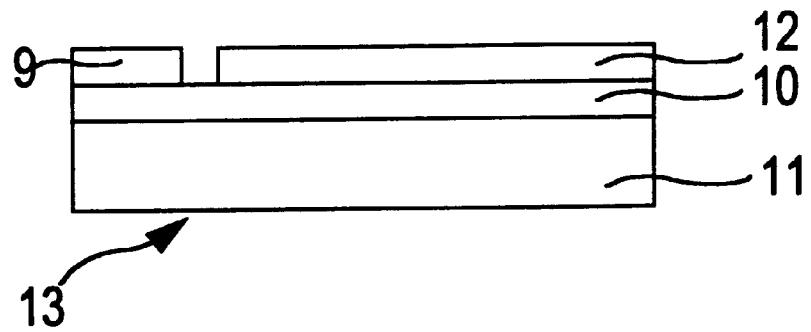

FIG. 6 shows a further embodiment of the present invention wherein the contact tab 13 is designed to be similar to that in FIG. 5. In addition to the solder strip 9, however it further has an insulating layer 12 with which virtually the entire surface of the electrically conductive layer 10 is covered or laminated. This insulating layer 12 may be a further plastic layer, which directly adjoins the solder strip 9 or, as illustrated, is spaced apart from this.

If laser-beam soldering is used as the application method, then it is particularly advantageous if the contact tabs according to FIGS. 5 and 6 include a carrier 11 that is transparent to the wavelength of the laser used; for example, the Kapton film mentioned. In this way, the laser-beam soldering can be carried out with the lowest expenditure of energy wherein the laser energy is able to be coupled virtually completely into the solder 9 to be melted. Thermal loading of the film 11 or of the piezoelectric actuator 1 is avoided in this case.

Although the present invention has been described with reference to specific embodiments, those of skill in the art will recognize that changes may be made thereto without departing from the spirit and scope of the invention as set forth in the hereafter appended claims.

What is claimed is:

1. A piezoelectric actuator, comprising:
   a plurality of piezoelectric ceramic layers;
   a plurality of electrode layers alternately arranged with the plurality of piezoelectric ceramic layers, one above another, to form a stack;
   at least two metallization strips applied to sides of the stack, wherein the electrode layers are alternately connected with alternating polarity to the at least two metallization strips; and at least two contact tabs, each of the at least two contact tabs having an electrically conductive layer with a first portion connected to one of the at least two metallization strips over an entire height of the respectively connected electrode layers, each of the at least two contact tabs includes a projecting region extending from said first portion at a side of the respective metallization strip, said projecting region being a flag-like projection free of said metallization strip and free of said stack.

2. A piezoelectric actuator as claimed in claim 1, wherein the piezoelectric actuator is of a monolithic construction.

3. A piezoelectric actuator as claimed in claim 1, wherein each of the at least two contact tabs is formed of both an electrically conductive layer and a plastic layer.

4. A piezoelectric actuator as claimed in claim 3, wherein each of the at least two contact tabs is a metal-coated plastic film.

5. A piezoelectric actuator as claimed in claim 1, wherein the projecting region extends outward from the associated metallization strip at least 5 mm.

6. A piezoelectric actuator as claimed in claim 1, wherein each of the at least two contact tabs is formed of an electrically conductive layer and, in a region extending away from the associated metallization strip, is laminated with plastic on both sides and, in a region which connects to the associated metallization strip, is at most laminated with plastic on one side.

7. A piezoelectric actuator as claimed in claim 1, wherein each of the at least two contact tabs is formed of a plastic film coated with copper.

8. A piezoelectric actuator as claimed in claim 1, wherein each of the at least two metallization strips has a baked metallization composition.

9. A method for producing a piezoelectric actuator, comprising the steps of:

arranging a plurality of piezoelectric ceramic layers alternately with a plurality of electrode layers one above another to form a monolithic composite stack;

applying at least two metallization strips at sides of the stack;

connecting, alternately, the plurality of electrode layers with alternating polarity to the at least two metallization strips;

providing at least two contact tabs, wherein each contact tab has an electrically conductive layer; and connecting the electrically conductive layer of a portion of each of the at least two contact tabs to one of the at least two metallization strips over an entire height of the respectively connected electrode layers, a projecting region of each of the at least two contact tabs extends from said portion and remains free of contact with said metallization strips at a side of the respective metallization strip.

10. A method of producing a piezoelectric actuator as claimed in claim 9, further comprising the steps of:

forming a solder layer on the electrically conductive layer of each of the at least two contact tabs in a region to be connected to the associated metallization strip; and soldering the contact tab to the associated metallization strip.

11. A method of producing a piezoelectric actuator as claimed in claim 10, wherein the step of soldering is performed via laser soldering.

* * * * *